United States Patent
Lee et al.

(10) Patent No.: US 7,642,658 B2
(45) Date of Patent: Jan. 5, 2010

(54) PAD STRUCTURE TO PROMPT EXCELLENT BONDABILITY FOR LOW-K INTERMETAL DIELECTRIC LAYERS

(75) Inventors: Tze-Liang Lee, Hsin-Chu (TW); Yun-San Huan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 408 days.

(21) Appl. No.: 11/244,970

(22) Filed: Oct. 6, 2005

(65) Prior Publication Data
US 2006/0060967 A1 Mar. 23, 2006

Related U.S. Application Data

(62) Division of application No. 10/243,910, filed on Sep. 13, 2002, now Pat. No. 6,955,981.

(51) Int. Cl.
*H01L 23/52* (2006.01)
(52) U.S. Cl. ............... 257/784; 438/612; 257/E23.015; 257/E23.02; 257/E23.023
(58) Field of Classification Search ............... 257/758, 257/784, 786, 760, 774, E23.015, E23.02, 257/E23.023, E21.508, E21.506, E21.519; 438/612–622
See application file for complete search history.

(56) References Cited

U.S. PATENT DOCUMENTS

| | | | |
|---|---|---|---|
| 5,739,587 A | 4/1998 | Sato | |
| 5,923,088 A | 7/1999 | Shine et al. | |
| 6,198,170 B1 * | 3/2001 | Zhao | 257/784 |
| 6,236,114 B1 | 5/2001 | Huang et al. | |
| 6,258,715 B1 | 7/2001 | Yu et al. | |
| 6,287,950 B1 | 9/2001 | Wu et al. | |
| 6,455,943 B1 | 9/2002 | Sheu et al. | |
| 6,524,942 B2 * | 2/2003 | Tsai et al. | 438/612 |

FOREIGN PATENT DOCUMENTS

| | | |
|---|---|---|
| TW | 430935 | 4/2001 |
| TW | 439247 | 6/2001 |
| TW | 447103 | 7/2001 |

\* cited by examiner

*Primary Examiner*—Quoc D Hoang
(74) *Attorney, Agent, or Firm*—Haynes and Boone, LLP

(57) ABSTRACT

A method of fabricating a bonding pad anchoring structure comprising the following steps. Providing a substrate. Forming a series of grated metal layers over the substrate separated by an interleaving series of via plug layers having via plugs electrically connecting respective at least a portion of adjacent grated metal layers. The series of grated metal layers having an uppermost grated metal layer. Forming an uppermost via plug layer over the uppermost grated metal layer. The uppermost via plug layer having via plugs. Forming a bonding pad layer over the uppermost via plug layer so that the uppermost via plugs within the uppermost via plug layer electrically connect the bonding pad layer to at least a portion of the uppermost grated metal layer whereby the bonding pad layer is securely bonded to the substrate.

31 Claims, 4 Drawing Sheets

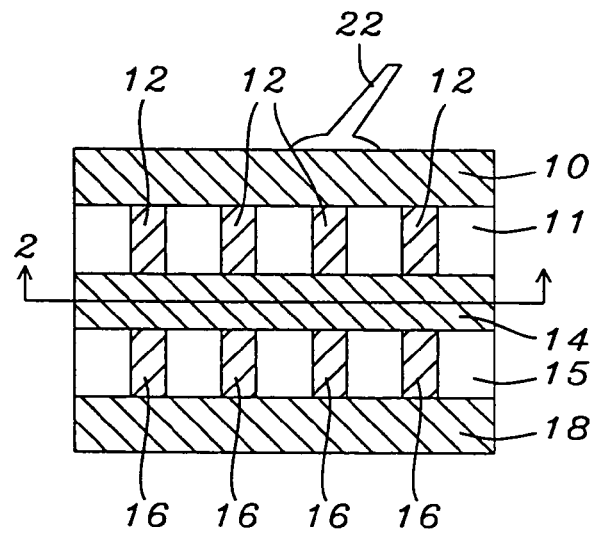
FIG. 1 – Prior Art
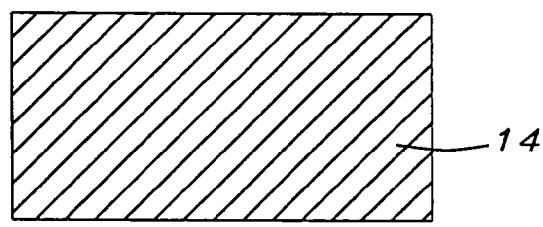
FIG. 2 – Prior Art
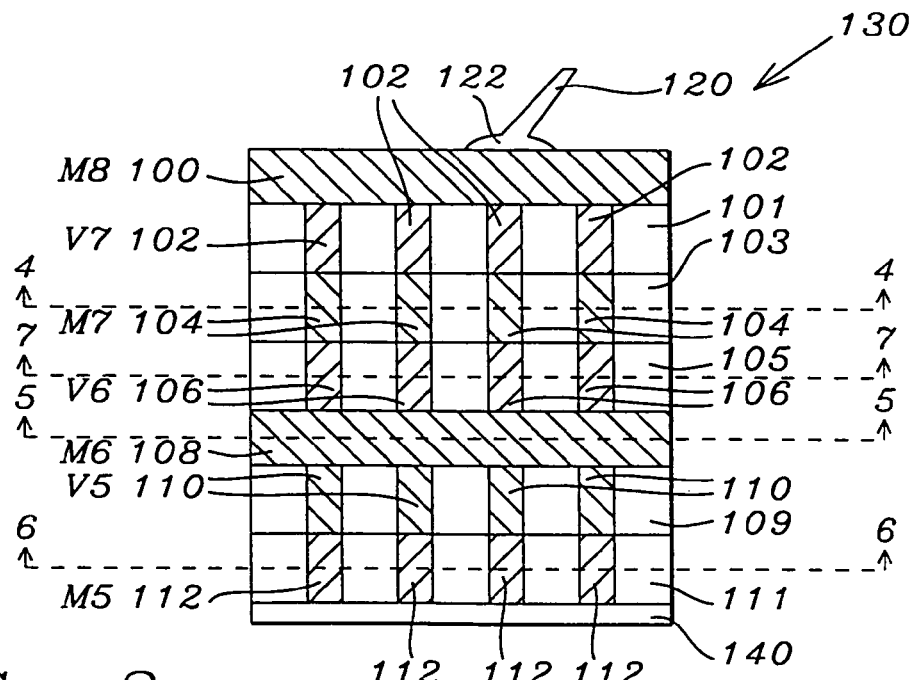
FIG. 3

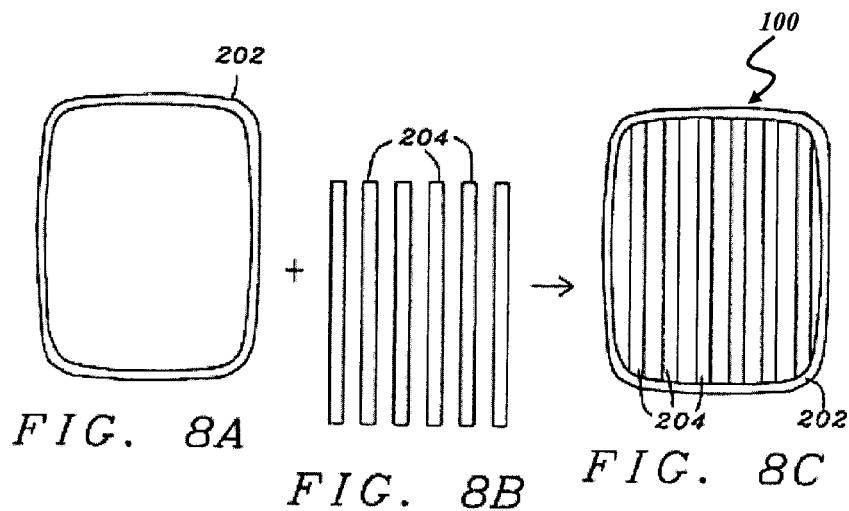
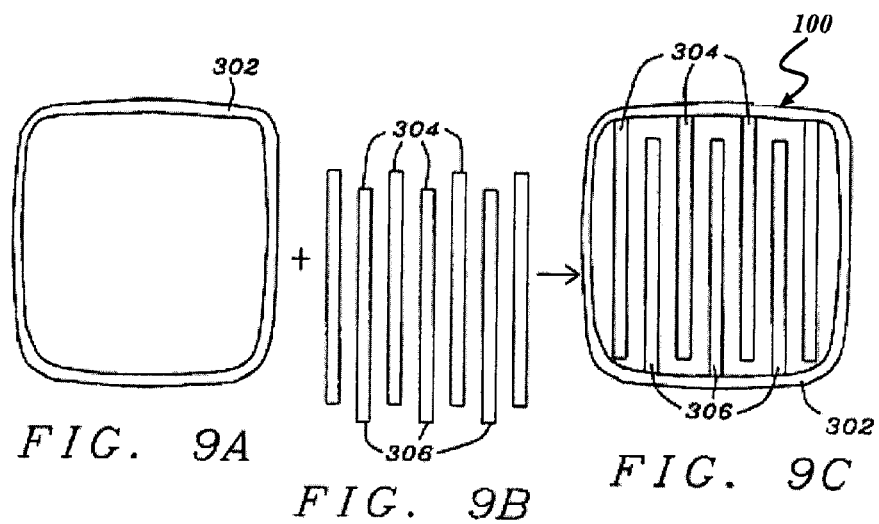

PAD STRUCTURE TO PROMPT EXCELLENT BONDABILITY FOR LOW-K INTERMETAL DIELECTRIC LAYERS

This application is a division of U.S. Ser. No. 10/243,910 filed Sep. 13, 2002 now U.S. Pat No. 6,955,981.

FIELD OF THE INVENTION

The present invention relates generally to semiconductor fabrication and more specifically to processes of fabricating pad structures.

BACKGROUND OF THE INVENTION

Poor bondability of bonding pads is a continuing issue to low-k Intermetal dielectric (IMD) layers. Pad peeling and craters have been found during wire bonding processes and post-testing. Mechanical stress also degrades performance.

For example, FIG. 1 illustrates a conventional N level bonding pad 10 with metal via anchors 12 (through IMD layer 11) anchoring and electrically connecting N level bonding pad 10 to N-1 level metal layer 14. Bonding wire 20 is electrically affixed to N level bonding pad 10 as at 22.

Metal via plugs 16 (through IMD layer 15) electrically connect N-1 level metal layer 14 to N-2 level metal layer 18. FIG. 2 is a cross-section of FIG. 1 taken along line 2-2 of FIG. 1, illustrating that the N-1 level, etc., metal layer 14 is a solid sheet layer. This structure suffers from the above described shortfalls.

U.S. Pat. No. 6,258,715 B1 to Yu et al. describes plugs under bonding pads to improve adhesion.

U.S. Pat. No. 6,236,114 B1 to Huang et al. describes a bonding pad with extra vias.

U.S. Pat. No. 5,923,088 to Shiue et al. describes a bonding pad structure with via plugs thereunder.

U.S. Pat. No. 5,739,587 to Sato describes another bonding pad structure with via plugs thereunder.

SUMMARY OF THE INVENTION

Accordingly, it is an object of one or more embodiments of the present invention to provide an improved method of anchoring a bonding pad.

Other objects will appear hereinafter.

It has now been discovered that the above and other objects of the present invention may be accomplished in the following manner. Specifically, a substrate is provided. Forming a series of grated metal layers over the substrate separated by an interleaving series of via plug layers having via plugs electrically connecting respective at least a portion of adjacent grated metal layers. The series of grated metal layers having an uppermost grated metal layer. Forming an uppermost via plug layer over the uppermost grated metal layer. The uppermost via plug layer having via plugs. Forming a bonding pad layer over the uppermost via plug layer so that the uppermost via plugs within the uppermost via plug layer electrically connect the bonding pad layer to at least a portion of the uppermost grated metal layer whereby the bonding pad layer is securely bonded to the substrate.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 1 and 2 schematically illustrate a prior art bonding pad anchoring structure with FIG. 2 being a cross-section of FIG. 1 along line 2-2.

FIGS. 3 to 7 schematically illustrate a preferred embodiment of the present invention with FIG. 4 being a cross-section of FIG. 3 along line 4-4; FIG. 5 being a cross-section of FIG. 3 along line 5-5; FIG. 6 being a cross-section of FIG. 3 along line 6-6; and FIG. 7 being a cross-section of FIG. 3 along line 7-7.

FIGS. 8A, 8B, and 8C schematically illustrate a plan view of a bonding pad anchored by the method of the present invention.

FIGS. 9A, 9B, and 9C schematically illustrate a plan view of an alternate bonding pad anchored by the method of the present invention.

DETAILED DESCRIPTION OF THE PREFERRED EMBODIMENT

Unless otherwise specified, all structures, layers, steps, methods, etc. may be formed or accomplished by conventional steps or methods known in the prior art.

As shown in FIG. 3, bonding pad anchoring structure 130 includes an uppermost metal layer M8, i.e. bonding pad 100 with a bonding wire 120 affixed to bonding pad 100 as at 122. Uppermost metal layer M8 need not be grated.

Figure 4:
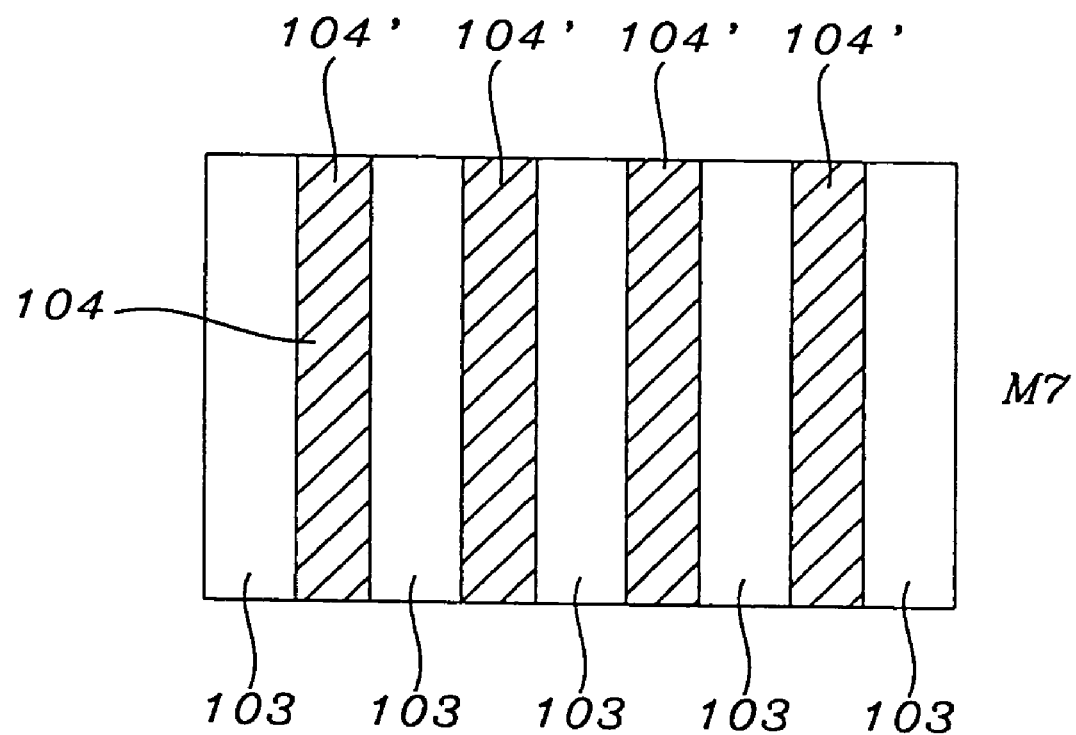

Metal V7 via plugs 102 formed through intermetal dielectric (IMD) layer 101 electrically connect M8 bonding pad 100 to M7 metal layer 104 formed through dielectric layer 103. Bonding pad 100 may be a solid sheet of metal or may be grated as are the underlying metal layers 104, 108, 112. As shown in FIG. 4, M7 metal layer 104 is grated and comprises spaced apart metal lines 104'.

Figure 5:
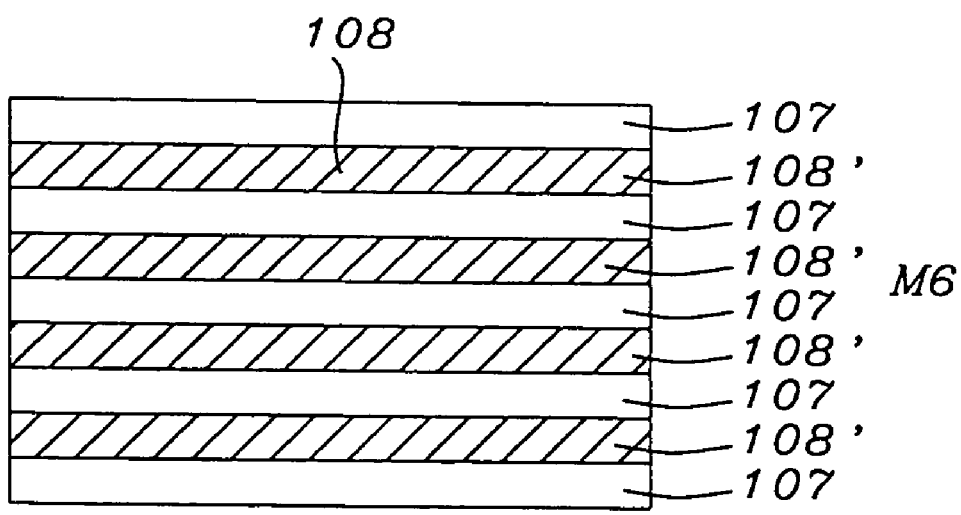
Figure 7:
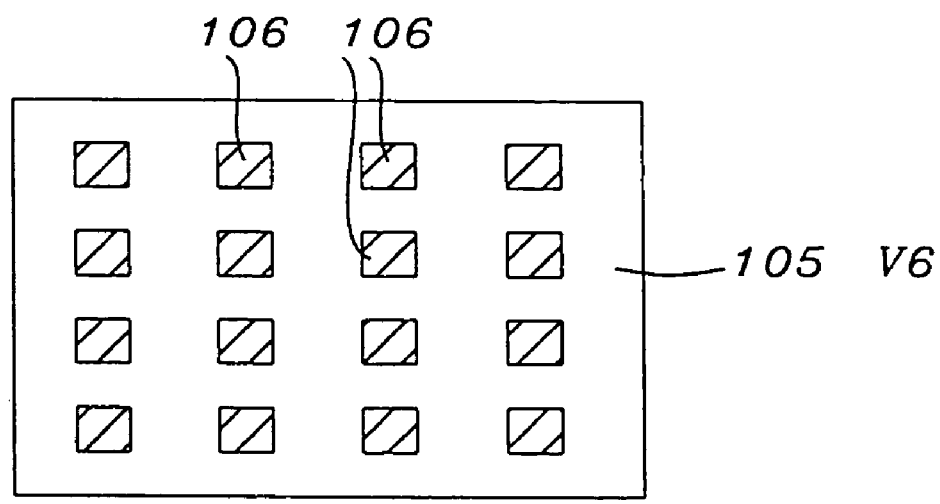

Metal V6 via plugs 106 formed through IMD layer 105 electrically connect M7 metal layer 104 to M6 metal layer 108 formed through low-k dielectric layer 107. As shown in FIG. 5, M6 metal layer 108 is also grated and comprises spaced apart metal lines 108'. As shown in FIG. 7, metal V6 via plugs 106 (as are metal V7 via plugs 102, metal V5 via plugs 110 and all underlying metal via plugs) are located at the intersection of the adjacent V7 metal layer 102 metal lines 102' and V6 metal layer 108 metal lines 108'.

As shown in FIGS. 3 and 5, M6 metal layer 108 metal lines 108' may be rotated at a ninety degree (90°) relative to M7 metal layer 104 metal lines 104'. This 90° rotation creates more interface between the metal and the low-k material in the lattice.

If current degradation is a problem due to the 90° rotation, M6 metal layer 105 metal lines 105' may be substantially parallel relative to M7 metal layer 104 metal lines 104'.

Figure 6:
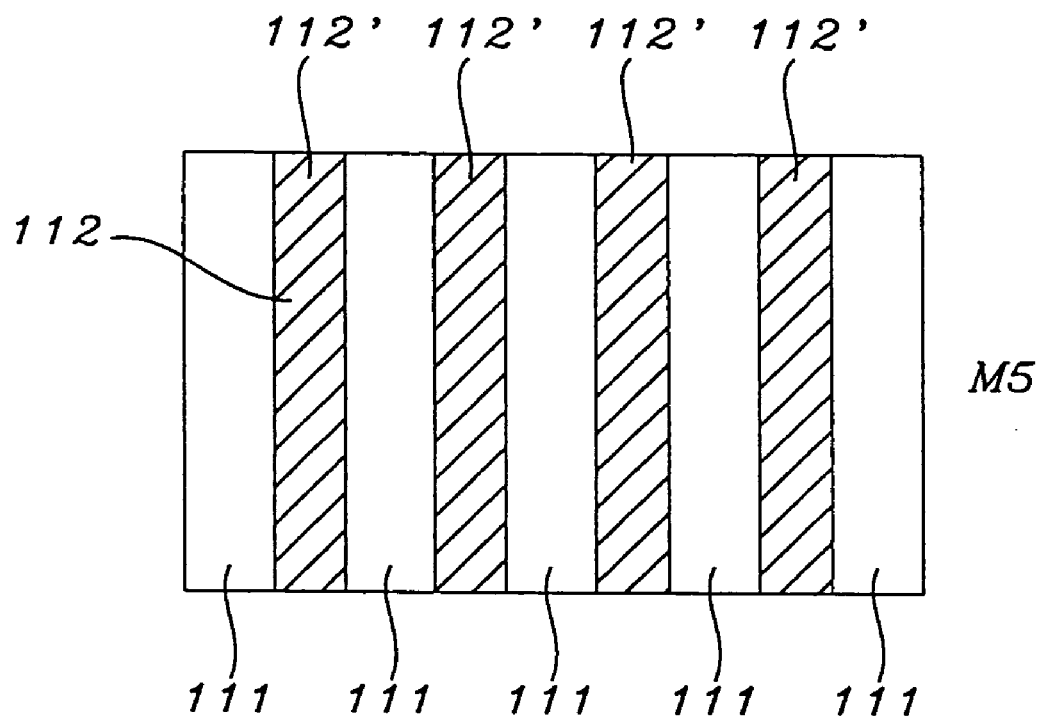

Metal V5 via plugs 110 formed through IMD layer 109 electrically connect M6 metal layer 108 to M5 metal layer 112 formed through low-k dielectric layer 109. As shown in FIG. 6, M5 metal layer 112 is also grated and comprises spaced apart metal lines 112'. As shown in FIGS. 3 and 6, M5 metal layer 112 metal lines 112' may be rotated at a ninety degree (90°) relative to M6 metal layer 108 metal lines 108'. This 90° rotation again creates more interface between the metal and the low-k material in the lattice.

Again, if current degradation is a problem due to the 90° rotation, M5 metal layer 112 metal lines 112' may be substantially parallel relative to M6 metal layer 108 metal lines 108'.

Additional metal via plugs/metal layers may be formed down to V1 and M1 layers (not shown) within structure 140.

Structure 40 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Each such additional lower metal layers are each comprised of spaced metal lines that may be either rotated substantially 90° relative to the immediately overlying metal layer or may be substantially parallel relative to the immediately overlying metal layer as shown and described herein.

The metal layers 100, 104, 108, 112, etc. the metal via plugs 102, 106, 110, etc. are preferably comprised of copper, aluminum, gold, tungsten (W) or titanium (Ti) and are more preferably copper. IMD layers 101, 105, 109 are preferably comprised of low-k material such as FSG, SiLK, nanoglass, Black Diamond™ (a product of Applied Materials of Santa Clara, Calif.), or a porous dielectric material. IMD layers 101, 105, 109 preferably have a dielectric constant (k) of less than about 3.2. IMD layers 101, 105, 109 each have a thickness of preferably from about 2000 to 10,000 Å and more preferably from about 4000 to 8000 Å.

Dielectric layers 103, 107, 111 are preferably comprised of low-k material such as FSG, SiLK, nanoglass, Black Diamond™ (a product of Applied Materials of Santa Clara, Calif.), or a porous dielectric material. Dielectric layers 103, 107, 111 preferably have a dielectric constant (k) of less than about 3.0. Dielectric layers 103, 107, 111 each have a thickness of preferably from about 2000 to 30,000 Å and more preferably from about 2500 to 10,000 Å.

Metal lines 104', 108', 112' (and any underlying metal lines) have a width of preferably from about 10,000 to 50,000 Å and more preferably from about 20,000 to 30,000 Å and are spaced apart preferably from about 10,000 to 50,000 Å and more preferably from about 10,000 to 30,000 Å. The widths and spacing of the metal lines 104', 108', 112' (and any underlying metal lines) are adjustable to accommodate the differing low-k materials comprising IMD layers 101, 105, 109 (and any underlying IMD layers).

The grating of metal lines 104', 108', 112' (and any underlying metal lines) achieves good bondability and eliminates any mechanical stress issue. Since the metal lines 104', 108', 112' (and any underlying metal lines) are adjacent to IMD, the main energy of the bonding wire 120 is absorbed upon the periphery of the metal lines 104, 108, 112 just as if the metal layers 104, 108, 112 (and any underlying metal lines) were solid sheets and can be absorbed by the multiple peripheries. Further, chemical mechanical polishing (CMP) dishing effects are reduced using the grating structure of the metal lines 104', 108', 112' (and any underlying metal lines). The lattice structure of the bonding pad anchoring structure 130 of the present invention improves the mechanical properties of the overall structure 130 akin to reinforced concrete.

In tests, the novel bonding pad anchoring structure 130 of the present invention produced about a 96% bonding yield and is admirable suited for 0.13 µm rule and beyond.

A First Bonding Pad 100 —FIGS. 8A, 8B, and 8C

FIGS. 8A, 8B, and 8C illustrate a plan view, i.e. a top down view, of one preferred structure of the bonding pad 100 having an outer metal ring 202 and a non-continuous series of spaced-apart, equal length grated metal lines 204. The outer metal ring 202 and grated metal lines 204 may comprise copper, aluminum, gold, tungsten, any other suitable material, and/or combinations thereof. In the present embodiment, the outer metal ring 202 and grated metal lines 204 comprise copper. Disposed in between the outer metal ring 202 and grated metal lines 204 may be low-k dielectric materials, such as FSK, SiLK, nanoglass, Black Diamond™ (a product of Applied Materials of Santa Clara, Calif.), a porous dielectric material, any other suitable low-k dielectric material, and /or combinations thereof. The grated metal lines 204 may be spaced apart at varying widths or equal widths, and the widths may be adjusted to accommodate differing low/k dielectric materials disposed between.

The bonding pad 100 illustrated in FIG. 8C may be used in other IMD layers 101, 105,109.

A Second Bonding Pad 100 —FIGS. 9A, 9B, and 9C

FIGS. 9A, 9B, and 9C illustrate a plan view, i.e. a top down view, of another preferred structure of the bonding pad 100 having an outer metal ring 302 and a non-continuous series of spaced-apart, equal length, staggered grated metal lines 304, 306. The outer metal ring 202 and grated metal lines 204 may comprise copper, aluminum, gold, tungsten, titanium, any other suitable material, and/or combinations thereof. In the present embodiment, the outer metal ring 202 and grated metal lines 204 comprise copper. Disposed in between the outer metal ring 202 and grated metal lines 204 may be a low-k dielectric material, such as FSG, SiLK. nanoglass, Black Diamond™ (a product of Applied Materials of Santa Clara, Calif.), a porous dielectric material, any other suitable low-k dielectric material, and/or combinations thereof. The grated metal lines 204 may be spaced apart at varying widths or equal widths, and the widths may be adjusted to accommodate differing low-k dielectric materials disposed between.

The bonding pad 100 illustrated in FIG. 9C may be used in other IMD layers 101, 105, 109.

According to a variation, one or more of the series of grated metal layers 104, 108 and 112 could have an outer metal ring and a series of non-continuous, spaced apart grated metal lines.

Advantages of the Present Invention

The advantages of one or more embodiments of the present invention include:
1. bonding pad bondability is improved;
2. mechanical stress due to the bonding wire is greatly reduced;
3. any metal cup dishing effect is automatically attenuated;
4. the package (pkg) level thermal property is improved; and
5. the peeling process issue is automatically resolved.

While particular embodiments of the present invention have been illustrated and described, it is not intended to limit the invention, except as defined by the following claims.

We claim:

1. A substrate having a bonding pad and bonding pad anchoring structure over the substrate that provides improved anchoring of a bonding pad, wherein the bonding pad is capable of being bonded with bonding wire, the bonding pad comprising:
   an outer metal ring structure forming a perimeter of the bonding pad; and
   a series of inner, spaced-apart non-continuous metal line structures within the outer metal ring structure, wherein a dielectric material is disposed between the outer metal ring structure and the series of inner, spaced-apart non-continuous metal line structures.

2. The bonding pad of claim 1, wherein the series of inner, spaced-apart non-continuous metal line structures includes ends contacting the outer metal ring structure.

3. The bonding pad of claim 1, wherein the series of inner, spaced-apart non-continuous metal line structures comprise alternating, staggered first and second metal line structures; the first and second metal line structures each having a first and second end wherein the first ends of the first metal line structures contact the outer metal ring structure and the second ends of the second metal line structures contact the outer metal ring structure.

4. An apparatus comprising:
a substrate;
a bonding pad anchoring structure provided on the substrate; and
a bonding pad provided on the anchoring structure, the bonding pad including an outer metal ring and a grating electrically coupled thereto, the grating including a series of alternating dielectric lines and metal lines.

5. An apparatus according to claim 4, wherein the anchoring structure includes alternating grated metal layers and via plug layers, each via plug layer having via plugs electrically coupled to portions of each grated metal layer adjacent thereto, the uppermost via plug layer being provided over the uppermost grated metal layer, and the via plugs of the uppermost via plug layer being electrically coupled to the bonding pad.

6. An apparatus according to claim 5,
wherein the grated metal layers each include metal lines made from one of copper, aluminum, gold, tungsten and titanium; and
wherein the via plugs are made from one of copper, aluminum, gold, tungsten and titanium.

7. An apparatus according to claim 6, wherein the metal lines are made from copper, and the via plugs are made from copper.

8. An apparatus according to claim 5, wherein each via plug layer includes an IMD layer, and has the via plugs thereof extending through the IMD layer thereof.

9. An apparatus according to claim 5,
wherein each via plug layer includes an IMD layer, and has the via plugs thereof extending through the IMD layer thereof, each IMD layer being made from one of FSG, SiLK, nanoglass, and a porous dielectric material; and
wherein each grated metal layer includes a dielectric layer, and grated metal lines that extend through the dielectric layer thereof, each dielectric layer being made from one of FSG, SiLK, nanoglass, and a porous dielectric material.

10. An apparatus according to claim 5, wherein each grated metal layer includes a dielectric layer, and grated metal lines that extend through the dielectric layer thereof and that are oriented substantially parallel to one another.

11. An apparatus according to claim 5, wherein each grated metal layer includes a dielectric layer, and grated metal lines that extend through the dielectric layer thereof the grated metal lines of one of the grated metal layers extending substantially perpendicular to the grated metal lines of another of the grated metal layers.

12. An apparatus according to claim 5, wherein at least one of the grated metal layers includes an outer metal ring and a grating electrically coupled thereto, the grating including a series of spaced metal lines.

13. An apparatus according to claim 4, wherein a bonding wire is connected to the bonding pad.

14. An apparatus according to claim 4, wherein the metal lines of the bonding pad are each coupled at each end to the outer metal ring.

15. An apparatus according to claim 4, wherein the metal lines of the bonding pad are staggered and are each coupled at only one end to the outer metal ring.

16. An apparatus comprising:
a substrate;
a bonding pad including metal and dielectric materials, wherein the bonding pad comprises an outer metal ring electrically coupled to a grating having a series of spaced metal lines, a dielectric material disposed between the spaced metal lines; and
a bonding pad anchoring structure provided in between the substrate and the bonding pad, wherein the bonding pad anchoring structure includes alternating grated metal layers and via plug layers, each grated metal layer having a series of spaced metal lines, each via plug layer having via plugs electrically coupled to portions of each grated metal layer adjacent thereto, the uppermost via plug layer being provided over the uppermost grated metal layer, and the via plugs of the uppermost via plug layer being electrically coupled to the bonding pad.

17. An apparatus according to claim 16,
wherein the metal lines of each grated metal layer are made from one of copper, aluminum, gold, tungsten and titanium; and
wherein the via plugs of each via plug layer are made from one of copper, aluminum, gold, tungsten and titanium.

18. An apparatus according to claim 17, wherein the metal lines are made from copper, and the via plugs are made from copper.

19. An apparatus according to claim 16, wherein each via plug layer includes an IMD layer, and has the via plugs thereof extending through the IMD layer thereof 20. An apparatus according to claim 16,
wherein each via plug layer includes an IMD layer, and has the via plugs thereof extending through the IMD layer thereof, each IMD layer being made from one of FSG, SiLK, nanoglass, and a porous dielectric material; and
wherein each grated metal layer includes a dielectric layer, and has the grated metal lines thereof extending through the dielectric layer thereof, each dielectric layer being made from one of FSG, SiLK, nanoglass, and a porous dielectric material.

21. An apparatus according to claim 16, wherein each grated metal layer includes a dielectric layer, and has the grated metal lines thereof extending through the dielectric layer thereof, and oriented to extend substantially parallel to one another.

22. An apparatus according to claim 16, wherein each grated metal layer includes a dielectric layer, and has the grated metal lines thereof extending through the dielectric layer thereof, the grated metal lines of one of the grated metal layers extending substantially perpendicular to the grated metal lines of another of the grated metal layers.

23. An apparatus according to claim 16, wherein a bonding wire is connected to the bonding pad.

24. An apparatus according to claim 16, wherein the spaced metal lines are each coupled at each end to the outer metal ring.

25. An apparatus according to claim 16, wherein the spaced metal lines are staggered and are each coupled at only one end to the outer metal ring.

26. An integrated circuit device comprising:
a bonding pad formed in a bonding pad metal layer, the bonding pad being defined by a bonding pad area;
a first metal layer beneath the first bonding pad metal layer, the first metal layer including a plurality of first elongated metal lines under the bonding pad area, the plurality of first elongated metal lines running in a first direction;

a second metal layer beneath the first metal layer, the second metal layer including a plurality of second elongated metal lines under the bonding pad area, the plurality of second elongated metal lines running in a second direction;

a first via layer between the first and second metal layers, the first via layer including at least 50% dielectric material directly underlying the bonding pad area and being absent any elongated metal lines directly underlying the bonding pad area; and a semiconductor substrate underlying the second metal layer;

wherein a length of each elongated metal line is substantially longer than a width of such line.

27. The device of claim 26, wherein the first direction is perpendicular to the second direction.

28. The device of claim 26, wherein the first via layer includes a plurality of substantially-symmetrically-shaped metal plugs for interconnecting the first elongated lines with the second elongated lines.

29. The device of claim 26 further comprising:

a second via layer between the bonding pad metal layer and the first metal layer, the second dielectric layer being absent any elongated metal lines directly underlying the bonding pad area.

30. The device of claim 29, wherein the second via layer includes a plurality of substantially-symmetrically-shaped metal plugs for interconnecting at least one of the first elongated lines with the bonding pad.

31. An integrated circuit device comprising:

a bonding pad formed in a bonding pad metal layer, the bonding pad being made of solid metal defining a bonding pad area;

a first metal layer beneath the first bonding pad metal layer;

a second metal layer beneath the first metal layer, the second metal layer including a plurality of elongated metal lines under the bonding pad area;

a first via layer between the first and second metal layers, the first via layer including a plurality of substantially-symmetrically-shaped metal plugs for interconnecting the first elongated lines with the second elongated lines and being absent any elongated metal lines directly underlying the bonding pad area; and a semiconductor substrate underlying the second metal layer;

wherein a length of each elongated metal line is substantially longer than a width of such line.

* * * * *